(12) United States Patent
Lanus (10) Patent No.: US 7,542,288 B2
(45) Date of Patent: Jun. 2, 2009

(54) SKEWED CARDCAGE ORIENTATION FOR INCREASING COOLING IN A CHASSIS

(75) Inventor: Mark S. Lanus, Tempe, AZ (US)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 0 days.

(21) Appl. No.: 11/749,502

(22) Filed: May 16, 2007

(65) Prior Publication Data
US 2008/0285233 A1 Nov. 20, 2008

(51) Int. Cl.
*H05K 7/20* (2006.01)
(52) U.S. Cl. .................. 361/695; 361/610; 361/694
(58) Field of Classification Search .......... 361/610, 361/694–695
See application file for complete search history.

(56) References Cited

U.S. PATENT DOCUMENTS

| | | | | |
|---|---|---|---|---|
| 3,001,102 A | * | 9/1961 | Stiefel et al. ............... | 361/725 |
| 3,280,377 A | * | 10/1966 | Alban et al. ................ | 361/796 |
| 4,149,218 A | * | 4/1979 | Carrubba et al. ............ | 361/691 |
| 5,497,288 A | * | 3/1996 | Otis et al. .................... | 361/687 |
| 5,886,872 A | * | 3/1999 | Koenen et al. .............. | 361/719 |
| 6,501,650 B2 | * | 12/2002 | Edmunds et al. ............ | 361/695 |
| 6,924,981 B2 | * | 8/2005 | Chu et al. .................... | 361/696 |
| 7,355,848 B1 | * | 4/2008 | Hodge et al. ................ | 361/690 |
| 2002/0141156 A1 | * | 10/2002 | Edmunds et al. ............ | 361/694 |

* cited by examiner

*Primary Examiner*—Gregory D Thompson
(74) *Attorney, Agent, or Firm*—Harness, Dickey & Pierce, P.L.C.

(57) ABSTRACT

A chassis (300) for housing at least one cardcage (302) is disclosed. The chassis includes a first portion (420) of a chassis housing (300) through a sixth portion (460) thereof. The first through sixth portions forming a boundary around a storage region of the chassis housing (300). The chassis (300) also includes at least one air moving device (316). At least first (413) and second openings (425) are situated within the chassis housing (300). The first and (413) second openings (425) located at substantially different elevations relative to each other. A cardcage (302) is located in the storage region and situated in a skewed orientation relative to at least two of the portions of the chassis housing (300). The at least first (413) and second (425) openings and the at least one air moving device (316) are located relative to the skewed oriented cardcage (302) to facilitate airflow thereacross.

20 Claims, 5 Drawing Sheets

SKEWED CARDCAGE ORIENTATION FOR INCREASING COOLING IN A CHASSIS

FIELD OF THE INVENTION

The present invention generally relates to the field of information processing systems, and more particularly relates to cardcage orientation within a chassis.

BACKGROUND OF THE INVENTION

Figure 1:
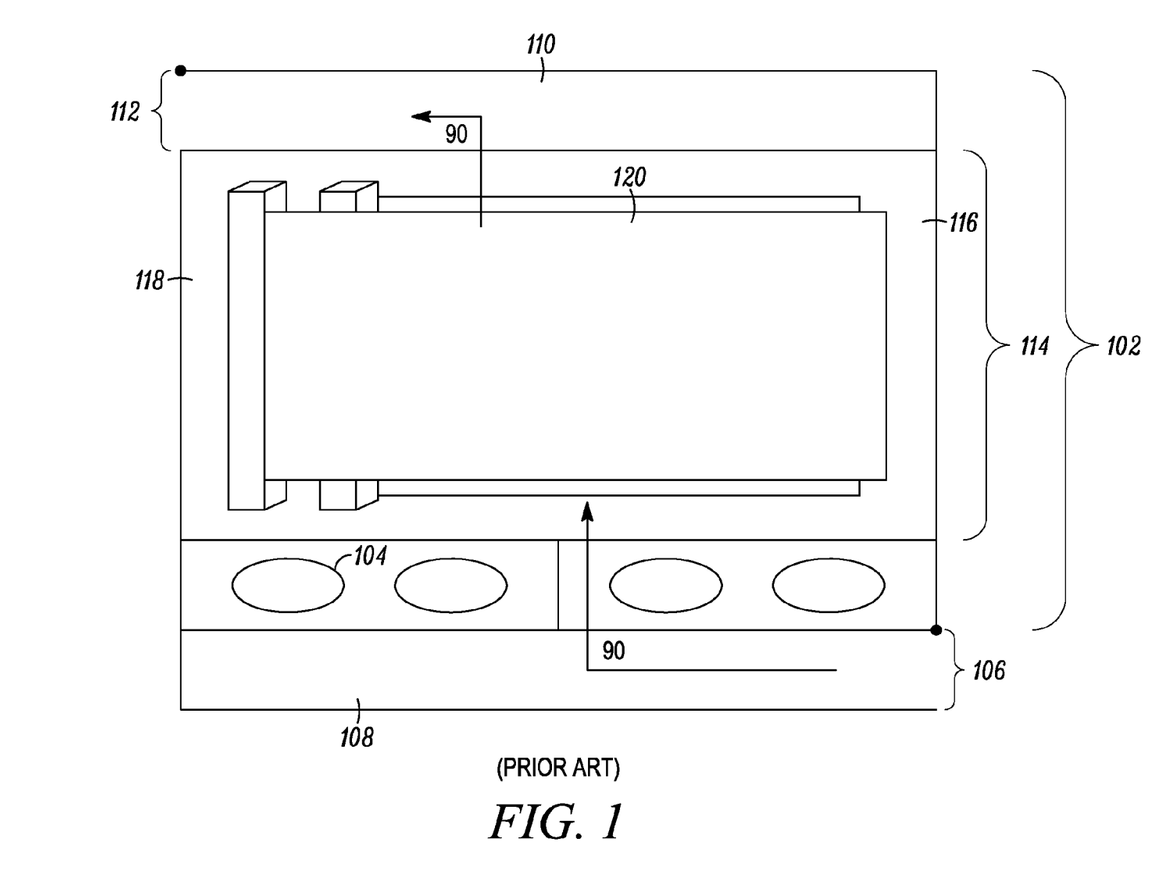
FIG. 1 is a side perspective view of a conventional parallel cardcage orientation within a chassis.

Current methods for orienting components within information processing systems such as servers, rack systems, personal computers, and the like, mount cardcages within a chassis in a parallel fashion. For example, FIG. 1 is a simple block diagram illustrating a front perspective view of a typical cardcage orientation within a chassis. FIG. 1 shows a chassis 102 that can reside, for example, within a rack. The chassis 102 includes a plurality of fans 104, a first opening 106 leading into an air intake plenum 108, and an air output plenum 110 leading to a second opening 112. The chassis 102 also includes a cardcage 114 that is situated in a parallel fashion. In other words, a first end 116 of the cardcage 114 is on the same plane (i.e., not higher than) as a second end 118 of the cardcage 114.

As the fans 104 draw air into the air intake plenum 108, the air flows in a 90 degree upwards direction through the fans 104 and over the electronics 120, e.g., printed circuit boards ("PCBs"), in the cardcage 114. Once the air flow reaches the air output plenum 110, the air flow is forced to take another 90 degree turn where the air exits out of the chassis 102 at the second opening 112.

One problem with this current configuration is that the air flow is unnecessarily restricted. For example, requiring two 90 degree turns as shown in FIG. 1 greatly reduces the benefits gained from cooling devices such as fans or blowers. Also, in configurations having cooling devices situated underneath a cardcage, if one fan fails a hot spot can occur in an area of the cardcage directly above the failed fan. This can cause the circuit boards in the cardcage to overheat and fail.

Therefore a need exists to overcome the problems with the prior art as discussed above.

SUMMARY OF THE INVENTION

Briefly, in accordance with the present invention, disclosed is a chassis for housing at least one cardcage. The chassis includes a first portion of a chassis housing, a second portion thereof, a third portion thereof, a fourth portion thereof, a fifth portion thereof, and a sixth portion thereof. The first through sixth portions forming a boundary around a storage region of the chassis housing. The chassis also includes at least one air moving device. At least first and second openings are situated in at least two of the first portion, the second portion, the third portion, the fourth portion, the fifth portion, and the sixth portion of the chassis housing, respectively. The first and second openings are located at substantially different elevations relative to each other. The at least one air moving device is located in proximity to at least one of the first and second openings to facilitate air flow therethrough. A cardcage is located in the storage region and designed and manufactured for holding one or more electronic circuit cards. The cardcage is situated in a skewed orientation relative to at least two of the portions of the chassis housing. The at least first and second openings and the at least one air moving device are located relative to the skewed oriented cardcage to facilitate airflow thereacross.

In another embodiment a chassis for housing at least one cardcage is disclosed. The chassis includes a top portion of a chassis housing, a bottom portion thereof, a front portion thereof, a rear portion thereof, a first side portion thereof, and a second side portion thereof. The top through second side portions forming a boundary around a storage region of the chassis housing. A plurality of air moving devices is also included. At least two air moving devices in the plurality of air moving devices are each mechanically coupled to at least first and second openings situated at diagonally opposing portions of the chassis housing to facilitate air flow therethrough. A cardcage is located in the storage region and is designed and manufactured for holding one or more electronic circuit cards. The cardcage is situated in a skewed orientation relative to at least two of the portions of the chassis housing. The plurality of air moving devices located relative to the skewed oriented cardcage to facilitate airflow thereacross.

In yet another embodiment a chassis for housing at least one cardcage is disclosed. The chassis includes a first portion of a chassis housing, a second portion thereof, a third portion thereof, a fourth portion thereof, a fifth portion thereof, and a sixth portion thereof. The first through sixth portions forming a boundary around a storage region of the chassis housing. The chassis also includes at least one air moving device. At least first and second openings are situated in at least two of the first portion, the second portion, the third portion, the fourth portion, the fifth portion, and the sixth portion of the chassis housing, respectively. The first and second openings are located at substantially different elevations relative to each other. The at least one air moving device is located in proximity to at least one of the first and second openings to facilitate air flow therethrough. A cardcage is located in the storage region and designed and manufactured for holding one or more electronic circuit cards. The cardcage is situated in a skewed orientation relative to at least two of the portions of the chassis housing. The at least first and second openings and the at least one air moving device are located relative to the skewed oriented cardcage to facilitate airflow thereacross. The cardcage includes opposing first and second ends. The skewed oriented first end of the cardcage is situated higher in the storage region than the second end of the cardcage in the storage region.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

One advantage of the present invention is that a skewed cardcage orientation is provided for mounting a cardcage within a chassis. The skewed cardcage orientation is advantageous because the air flow within the chassis is less restricted than with conventional parallel orientations. The present invention decreases the number of air moving devices needed to effectively cool components within the cardcage or provide better cooling with the same number of fans. Another advantage of the present invention is that the surface area of the air plenums within a chassis is increased by the skewed cardcage orientation. This allows for even greater air flow and better cooling by moving more cool air into the chassis and forcing more hot air out of the chassis. Yet another advantage is that chassis height is reduced by implementing a skewed cardcage orientation.

Cardcage

Figure 2:
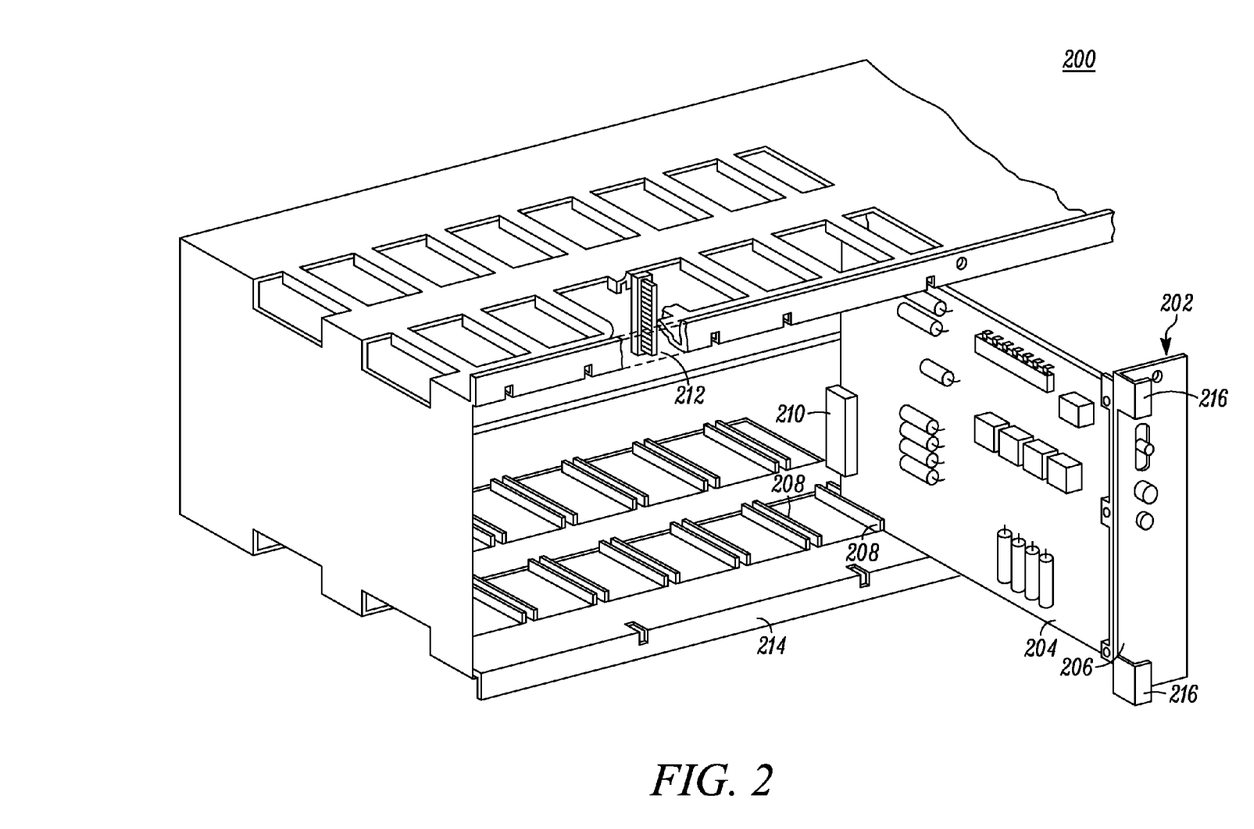
FIG. 2 is a front angled perspective view of a cardcage according to an embodiment of the present invention.

According to an embodiment of the present invention, FIG. 2 shows an example of a cardcage 200, which is an enclosure for holding PCBs. It should be noted that the cardcage 200 of FIG. 2 is only one example and does not limit the present invention in any way. The present invention is applicable to any enclosure that houses PCBs that can be mounted within a chassis.

FIG. 2 shows a cardcage 200 including one or more integrated subunits or panel assemblies 202. The panel assembly 202 is housed within cardcage 200 and includes a PCB 204 affixed to a subpanel 206. The subpanel 206 with attached PCB 204 can be inserted edgewise into the cardcage 200 at a location wherein the top and bottom edges thereof fit within the provided channel tracks 208 located along the interior of the bottom and top walls. The PCB 204 may then be pushed inwardly to a position whereby the electrical connector 210 mounted at the end of PCB 204 is positioned adjacent and aligned with a corresponding electrical connector 212 mounted on the back wall of cardcage 200.

One of these connectors may be a female type and the other a male type. In one example, when the subpanel 206 is moved to a final position whereby the PCB connector 210 mates with the backplane connector 212 the subpanel 206 is flush with a bottom edge 214 of the cardcage 200. The subpanel 206 can also include one or more handles 216 that facilitate the installation or removal of the subpanel 206 from the cardcage 200.

Skewed Cardcage Orientation within a Chassis

Figure 3:
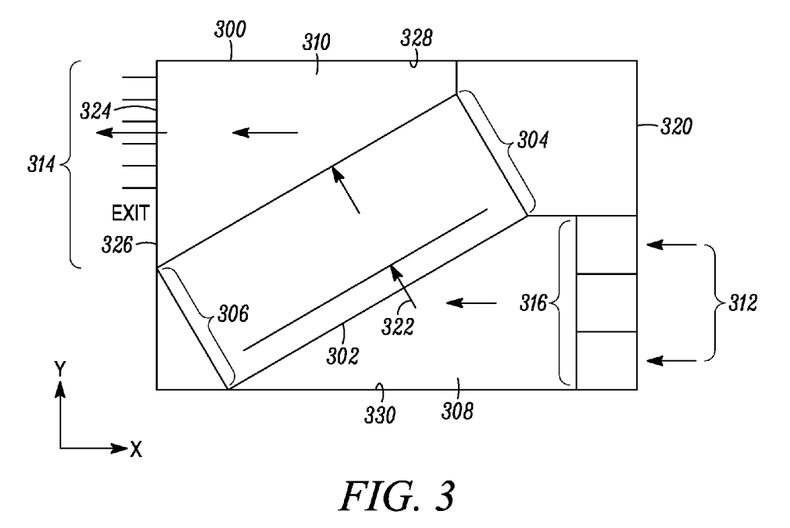
FIG. 3 is a side perspective view of a chassis showing a skewed cardcage orientation according to an embodiment of the present invention.

FIG. 3 is a side perspective view of a chassis 300. The chassis 300 is an enclosure that houses one or more cardcages. The chassis 300 can also be mounted within a rack, cabinet, or the like. FIG. 3 shows a cardcage 302 situated in a non-parallel or skewed orientation within the chassis 300. The cardcage 302 is situated within the chassis 300 so that a first end 304 of the cardcage 302 is higher than a second end 306 of the cardcage 302. It should be noted that the cardcage 302 can also be situated within the chassis 300 so that the second end 306 of the cardcage 302 is higher than the first end 304 of the cardcage 302.

The orientation of cardcage 302 creates a first plenum 308 and a second plenum 310. In one embodiment, the first plenum 302 is located in a bottom portion 312 of the chassis 300. The second plenum 310 is located in an upper portion 314 of the chassis 300. The bottom portion 312 of the chassis 300 comprises one or more air moving devices 316. FIG. 3 shows one or more air moving devices 316 such as a fan, however, any air moving device such as a blower can be used. As shown in the present embodiment, the air moving device(s) 316 is affixed to a front panel 320 of the chassis 300.

The air moving device(s) 316 draws or blows air into the first plenum 308, which in this example is an air intake plenum. The air flows from the first plenum 308 over\through the cardcage 302 as shown by the arrows 322. As the air flows over\through the cardcage 302, the PCB boards within the cardcage 302 are cooled. One advantage of the present invention is that the air flow from the first plenum 308 to the cardcage 302 is less restricted than in the chassis of FIG. 1. This is because the orientation of the cardcage 302 in FIG. 2 is skewed within the chassis 300. As can be seen from FIG. 3, the air flow is not required to make a 90 degree turn from the first plenum 308 to flow over\through the cardcage 302. Stated differently, the airflow makes less than a 90 degree turn. As the air flows over\through the cardcage 302, the air enters the second plenum 310, which in this example is an air output plenum. The air flows from the second plenum out an opening 324 (which can be vented) located in the upper portion 314 of the chassis 300. The air exiting the chassis 300 through the opening 324 is generally hot air. FIG. 3 shows the opening 324 situated on a back panel 326 of the chassis 300.

Another advantage of the present invention is that the air flow is not required to make a 90 degree turn when moving from the cardcage 302 into the second plenum 310. Therefore, the complete airflow path from the first plenum 308 over\through the cardcage 302 and into the second plenum 310 where the air exits out of the chassis 300 is less restricted than with conventional cardcage orientations. This allows for more efficient cooling of the cardcage and its components with less fans or better cooling with an equal number of fans as compared to a conventional chassis configuration.

For example, because the air flow is less restricted more air flows through the chassis 300 thereby decreasing the number of fans needed to cool the chassis. Also, by skewing the orientation of the cardcage 302, uniform cooling can occur by placing the air moving device(s) 316 away from the cardcage 302. In conventional chassis configurations, as shown in FIG. 1, the air moving device(s) 316 are located on a bottom panel of the chassis situated directly underneath and parallel to the cardcage. If one fan fails, the potential for a hot spot occurring on the corresponding cardcage area is great. However, the skewed orientation of the cardcage in the present invention provides a less restrictive environment for the air flow and allows the fans to be placed away from the cardcage 302. If one air moving device fails, the other(s) air moving devices can still uniformly cool the cardcage.

It should be noted that the present invention is not limited to the chassis configuration of FIG. 3; other chassis configurations are also applicable to the present invention. For example, instead of a top panel 328 and a bottom panel 330 of the chassis being closed, as shown in FIG. 3, one or more of these panels 328, 330 can be open or have an open portion. For example, instead of the opening 324 being located on the back panel 326, as shown in FIG. 3, the opening 324 can be located on the top panel 328 of the chassis 300.

Additionally, an opening can be situated on the back panel 326, as shown in FIG. 3, and on the top panel 328. This provides two openings for the air to exit from the chassis 300. Air moving devices can also be affixed to the bottom panel 330 in addition to the front panel 320. The locations of opening(s) 324 for hot air to escape the chassis and air moving devices shown in FIG. 3 can also be reversed. In other embodiments, the air moving device(s) 316 can be located on an upper portion of the chassis 300 and the escape opening can be located on a bottom portion of the chassis 300. The air escape opening 324 and the air moving device(s) 316 can also be located on side panels (not shown) of the chassis in addition to\with any of the configurations discussed above.

Three-Dimensional View of a Skewed Cardcage Orientation

Figure 4:
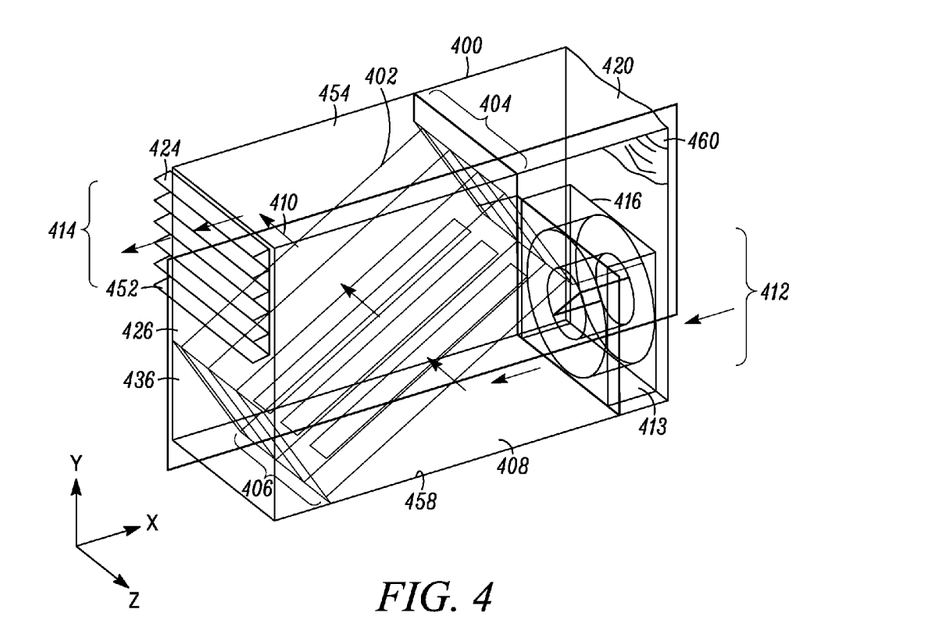
FIG. 4 is a three-dimensional view of a chassis showing a skewed cardcage orientation according to another embodiment of the present invention.

FIG. 4 is a three-dimensional view of the skewed cardcage orientation of FIG. 3. FIG. 4 shows a chassis 400. The cardcage 402 is situated within the chassis 400 in a skewed orientation as discussed above with respect to FIG. 3. A first portion 404 of the cardcage 402 is positioned higher than a second portion 406 of the cardcage 402. An air moving device 416 is positioned at a bottom portion 412 of a front panel 420 of the chassis 400. The air moving device 416 is mechanically coupled to a first opening 413 and draws or blows air into a first plenum 408 located in at least a part of the bottom portion 412 of the chassis 400. The air flows from the first plenum 408 over/through the cardcage 402 at an angle that is less restrictive than 90 degrees.

The air flow then continues into a second plenum 410 which is located in at least a part of an upper portion 414 of the chassis 400. The air flows into the second plenum 410 and out of the chassis via a second opening 424 at an angle that is less restrictive than 90 degrees. In one embodiment, the angle of the air flow path from the first plenum 408 to the cardcage 402 is symmetrical to the angle of the air flow path from the cardcage 402 out of the chassis 400. However, the angles do not have to be symmetrical. The air flows out of the chassis 400 via the opening 424 situated in the upper portion 414 of the chassis on a back panel 426. FIG. 4 shows the opening 424 including vents or grill 452.

It should be noted that the front panel 420 and one or more of the other chassis panels are optional. The air moving device 416 can be secured to the chassis in various ways and can be fixed or removable. The rear panel 426, top panel 454, first side panel 436, bottom panel 458, second side panel 460 are removable or can be opened so that the cardcage 402 may be interacted with, removed, installed, or the like. For example, a technician may want to add or remove a PCB from the cardcage 402. In one embodiment, a top panel 454 and/or the front panel 420 are removable or able to be opened so that a PCB can be slid in and out of the cardcage at the same angle that the cardcage is situated at. In this example, the cardcage can remain situated at its current orientation and the PCBs can be inserted\removed at the appropriate angle.

Figure 5:
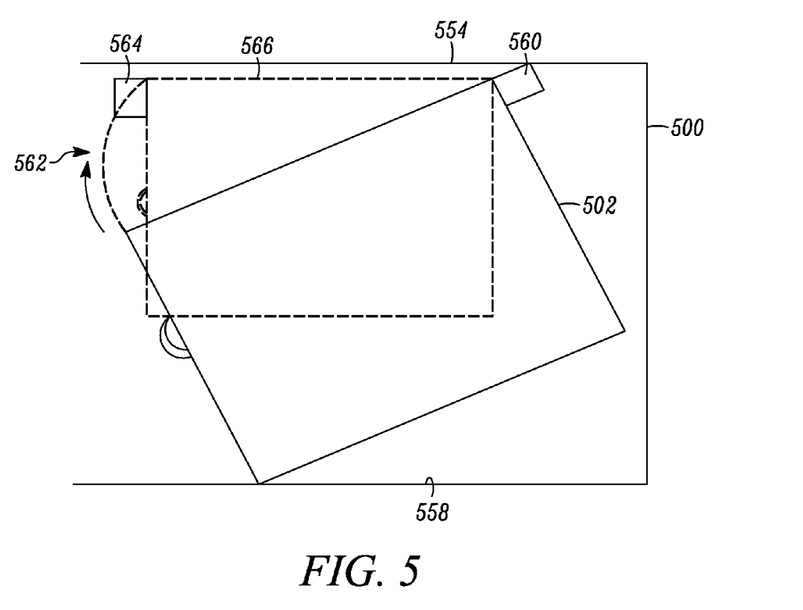
FIG. 5 is a side perspective view of a chassis showing one example of how a skewed cardcage can be transitioned to a different position for removal/installation of printed circuit boards according to an embodiment of the present invention.

In another embodiment, as shown in FIG. 5, a cardcage 502 can be coupled to a pivoting member 560 such as a hinge within a chassis 500. The pivoting member 560, in this example is affixed to a portion of a top panel 554. The pivoting member 560 allows the cardcage 502 to be pivoted about an axis. For example, FIG. 5 shows that the cardcage 502 can be pivoted in an upward direction as shown by the dashed lines 562. As the cardcage 502 is pivoted upwards it communicates with a locking member 564 to retain the cardcage 502 in a parallel position as shown by the dashed box 566. This allows POB boards to be inserted and removed in a direction that is parallel to the top and bottom panels 554, 558. It should be noted that the cardcage 502 can be placed at any angle for removal\installation of PCBs.

Air Flow Simulations

Figure 6:
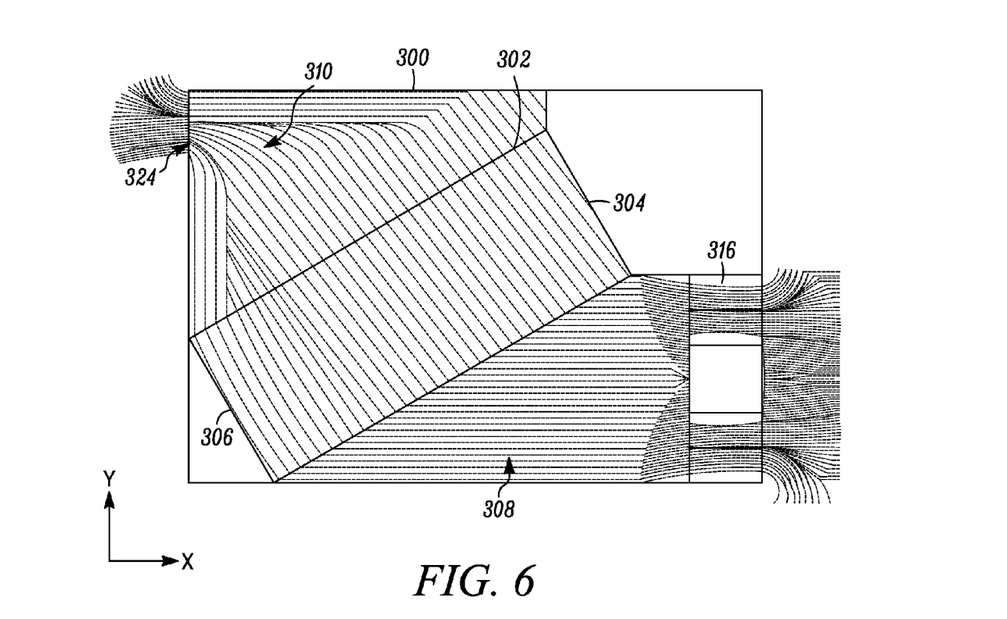
FIG. 6 is a side perspective view of a chassis showing an air flow simulation for a skewed cardcage orientation according to another embodiment of the present invention.

FIG. 6 is a side perspective view of the chassis 300 showing an air flow simulation for the skewed cardcage orientation discussed above with respect to FIG. 3. FIG. 6 shows air being drawn into the first plenum 308 via two of the air moving device(s) 316. As discussed above, the air moves from the first plenum 308 over\through the cardcage 302. The cardcage 302, in this embodiment, is maintained within the chassis 300 having the first end 304 situated higher than the second end 306 of the cardcage. As discussed above, this orientation results in a less restrictive air flow path. As shown in FIG. 6, the air flow moves from the first plenum 308 to the cardcage 302 at an angle that is less restrictive than 90 degrees. Also, the angle taken by the air flow to move from the cardcage 302 into the second plenum 310 and out of the chassis 300 via the opening 324 is also a less restrictive angle than 90 degrees. The less restrictive air flow path is a result of the skewed cardcage orientation.

Figure 7:
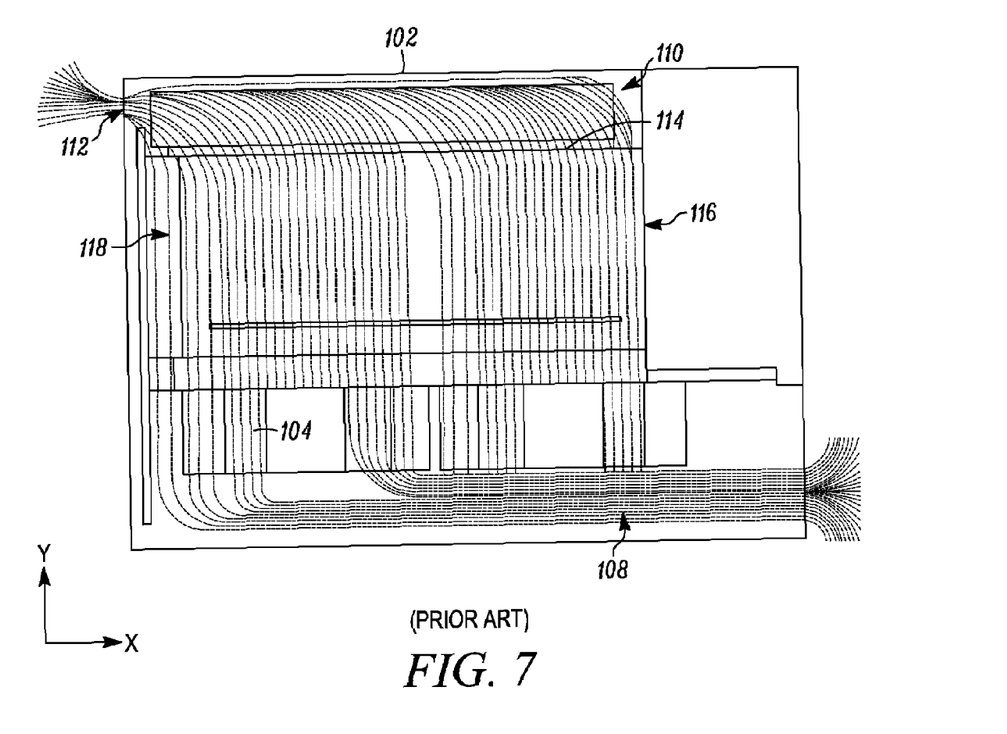
FIG. 7 is a side perspective view of a chassis showing an air flow simulation for a conventional parallel cardcage orientation.

FIG. 7 illustrates an air flow simulation for the conventional card cage orientation of FIG. 1. FIG. 7 shows air being drawn into the first plenum 108 by multiple air moving devices 104 in parallel. FIG. 7 is a side perspective view of the chassis 102 showing an air flow simulation for a conventional parallel orientation of the cardcage 114 as discussed above with respect to FIG. 1. As the air flows from the first plenum 108 to the cardcage 114, the air takes a 90 degree upward turn. As the air flows from the cardcage 114 to the second plenum 110, it takes another 90 degree turn as shown by FIG. 7. The air then exits out of the opening 112. The parallel orientation (the first end 116 of the cardcage) 114 being at the same height as the second end 118 of the cardcage results in a more restrictive air flow path that causes less air flow within the chassis 102.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A chassis for housing at least one cardcage, comprising:
   a first portion, a second portion, a third portion, a fourth portion, a fifth portion, and a sixth portion, the first through sixth portions forming a boundary around a storage region of the chassis;
   at least one air moving device;
   at least first and second openings situated in at least two of the first portion, the second portion, the third portion, the fourth portion, the fifth portion, and the sixth portion of the chassis;

the first and second openings located at substantially different elevations relative to each other and being at opposing end portions of the chassis;

one of the first, second, third, fourth, fifth and sixth portions forming a top wall of the chassis, and the at least one air moving device being located generally perpendicular to the top wall at one of said first and second openings to facilitate airflow through the chassis;

a cardcage located in the storage region that holds one or more electronic circuit cards, and wherein the cardcage is situated in a skewed orientation relative to the at least first and second openings, and in a skewed orientation relative to the at least one air moving device to facilitate airflow thereacross.

2. The chassis of claim 1, wherein the first end of the cardcage is situated higher in the storage region than the second end of the cardcage.

3. The chassis of claim 2, wherein the first end of the cardcage is a rear portion of the cardcage and the second end of the cardcage is a front portion of the cardcage.

4. The chassis of claim 2, wherein the first end of the cardcage is a front portion of the cardcage and the second end of the cardcage is a rear portion of the cardcage.

5. The chassis of claim 1, wherein the at least one air moving device comprises at least one of a fan and a blower.

6. The chassis of claim 1, wherein:
the first portion comprises the top wall of the chassis;
the second portion comprises a bottom wall of the chassis;
the third portion comprises a front wall of the chassis;
the fourth portion comprises a rear wall of the chassis;
the fifth portion comprises a first side wall of the chassis; and
the sixth portion comprises a second side wall of the chassis.

7. The chassis of claim 1, further comprising:
a first plenum and a second plenum that are mechanically coupled with the first opening and second opening, respectively, for guiding air flow between the storage region to an area outside of the chassis;
wherein one of the first and second openings is located at an elevation approximately at or above a top portion of the cardcage and the other one of the first and second openings is located at an elevation approximately at or below a bottom portion of the cardcage; and
the at least one air moving device facilitating air flow between the first and second openings and thereby airflow across the cardcage.

8. The chassis of claim 7, wherein:
the first opening is situated in one of a front portion of the chassis and a rear portion of the chassis;
the second opening is situated in the other one of the front portion of the chassis and the rear portion of the chassis, and wherein the air flow between the first and second openings, and thereby airflow across the cardcage, is from the one of the first and second openings that is at a lower elevation to the other one of the first and second openings that is at a higher elevation.

9. The chassis of claim 7, wherein:
the at least one air moving device is in proximity to one of the first and second openings to one of:
draw air flow into the storage region from outside the chassis, and
expel airflow out of the storage region to outside of the chassis.

10. The chassis of claim 9, further comprising:
an additional air moving device disposed generally perpendicular to said top wall; and
wherein the additional air moving device is in proximity to a second one of the first and second openings to one of:
draw air flow into the storage region from outside the chassis, and
expel airflow out of the storage region to outside of the chassis.

11. The chassis of claim 1, wherein the skewed orientation is configured such that an air flow path between the first opening and the cardcage encounters an angle that is greater than 90 degrees, and wherein an air flow path between the cardcage and the second opening encounters an angle that is greater than 90 degrees.

12. The chassis of claim 1, wherein a first end of the cardcage is coupled to at least one pivoting member to enable the cardcage to be moved from the skewed orientation to a parallel orientation where the first end of the cardcage and the second end of the cardcage are located at a substantially equal elevation relative to each other.

13. A chassis for housing at least one cardcage, the chassis comprising:
a top portion;
a bottom portion;
a front portion;
a rear portion;
a first side portion;
a second side portion;
the top portion, the bottom portion, the front portion, and rear portion; the first side portion and the second side portion forming a boundary around a storage region of the chassis;
at least first and second air moving devices that are each mechanically coupled to at least first and second openings, respectively, situated at diagonally opposing portions of the chassis to facilitate air flow through the housing;
the first and second air moving devices both being disposed generally perpendicular to said top portion;
a cardcage located in the storage region that holds one or more electronic circuit cards, and
wherein the cardcage is situated in a skewed orientation relative to at least two of the portions of the chassis, the first and second air moving devices located relative to the skewed orientation cardcage to facilitate airflow thereacross.

14. The chassis of claim 13, further comprising:
a first plenum and a second plenum that are mechanically coupled with the first opening and second opening, respectively, for guiding air flow between the storage region and outside of the chassis;
wherein one of the first and second openings is located at an elevation approximately at or above a top portion of the cardcage and the other one of the first and second openings is located at an elevation approximately at or below a bottom portion of the cardcage; and
the first and second air moving devices facilitating air flow between the first and second openings and thereby airflow across the skewed orientation cardcage.

15. The chassis of claim 14, wherein the first opening is situated in one of a front portion of the chassis housing and a rear portion of the chassis housing, and the second opening is situated in the other one of the front portion of the housing and the rear portion of the housing; and
wherein the air flow between the first and second openings, and thereby airflow across the skewed orientation cardcage, is from the one of the first and second openings that is at a lower elevation to the other one of the first and second openings that is at a higher elevation.

16. The chassis of claim 13, wherein the first air moving device is in proximity to one of the first and second openings to one of;
- draw air flow into the storage region from an area outside the chassis,
- expel airflow out of the storage region to an area outside of the chassis, and;
- wherein the second air moving device is in proximity to the other one of the first and second openings to one of;
- draw air flow into the storage region from outside the chassis, and expel airflow out of the storage region to outside of the chassis.

17. The chassis of claim 13, wherein the skewed orientation is configured such that an air flow path between the first opening and the cardcage encounters an angle that is greater than 90 degrees, and wherein an air flow path between the cardcage and the second opening encounters an angle that is greater than 90 degrees.

18. A chassis for housing at least one cardcage, the chassis comprising:
- a top portion;
- a bottom portion;
- a front portion;
- a rear portion;
- a first side portion;
- a second side portion;
- the top portion, the front portion, the rear portion, the first side portion and the second side portion forming a boundary around a storage region of the chassis;
- at least one air moving device;
- at least first and second openings situated in at least two of the first portion, the second portion, the third portion, the fourth portion, the fifth portion, and the sixth portion of the chassis, respectively, the first and second openings located at substantially different elevations relative to each other;
- wherein the at least one air moving device is located in proximity to at least one of the first and second openings to facilitate air flow therethrough, and is further disposed so as to be arranged generally pernendicular to said top portion; and
- a cardcage located in the storage region, that holds one or more electronic circuit cards, and wherein the cardcage is situated in a skewed orientation relative to at least two of the portions of the chassis, the at least first and second openings and the at least one air moving device located relative to the skewed orientation cardcage to facilitate airflow thereacross, wherein the cardcage comprises opposing first and second ends, and wherein the first end of the cardcage is situated higher in the storage region than the second end of the cardcage.

19. The chassis of claim 18, further comprising:
a first plenum and a second plenum that are mechanically coupled with the first opening and second opening, respectively, for guiding air flow between the storage region and outside of the chassis, and
wherein one of the first and second openings is located at an elevation approximately at or above a top portion of the cardcage and the other one of the first and second openings is located at an elevation approximately at or below a bottom portion of the cardcage, the at least one air moving device facilitating air flow between the first and second openings and thereby airflow across the skewed orientation cardcage, and
wherein the first opening is situated in one of a front portion and a rear portion of the chassis, and the second opening is situated in the other one of the front portion and the rear portion of the chassis, and
wherein the air flow between the first and second openings, and thereby airflow across the skewed orientation cardcage, is from the one of the first and second openings that is at a lower elevation to the other one that is at a higher elevation.

20. The chassis of claim 19, wherein:
the at least one air moving device is in proximity to one of the first and second openings to one of:
- draw air flow into the storage region from outside the chassis, and
- expel airflow out of the storage region to outside of the chassis, and
wherein an additional air moving device is in proximity to a second one of the first and second openings to one of:
- draw air flow into the storage region from outside the chassis, and
- expel airflow out of the storage region to outside of the chassis.

* * * * *